US008288869B2

(12) United States Patent
Huang et al.

(10) Patent No.: US 8,288,869 B2
(45) Date of Patent: Oct. 16, 2012

(54) SEMICONDUCTOR PACKAGE WITH SUBSTRATE HAVING SINGLE METAL LAYER AND MANUFACTURING METHODS THEREOF

(75) Inventors: Shih-Fu Huang, Zhudong Township (TW); Yuan-Chang Su, Luzhu Township (TW); Chia-Cheng Chen, Zhongli (TW); Kuang-Hsiung Chen, Taoyuan (TW); Ming-Chiang Lee, Kaohsiung (TW); Bernd Karl Appelt, Gulf Breeze, FL (US); Chia-Hsiung Hsieh, Yanshui Township (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 88 days.

(21) Appl. No.: 12/779,818

(22) Filed: May 13, 2010

(65) Prior Publication Data

US 2010/0320610 A1 Dec. 23, 2010

Related U.S. Application Data

(60) Provisional application No. 61/177,652, filed on May 13, 2009.

(30) Foreign Application Priority Data

Jul. 16, 2009 (TW) ............... 98124118 A

(51) Int. Cl.
*H01L 23/48* (2006.01)
(52) U.S. Cl. ................. 257/773; 257/666; 257/E23.01; 257/E21.575
(58) Field of Classification Search .......... 257/773, 257/666, E23.01, E21.575
See application file for complete search history.

(56) References Cited

U.S. PATENT DOCUMENTS

| 5,583,376 | A | 12/1996 | Sickler et al. |
| 5,592,025 | A | 1/1997 | Clark et al. |
| 5,874,784 | A | 2/1999 | Aoki et al. |
| 5,994,773 | A | 11/1999 | Hirakawa |
| 6,060,775 | A | 5/2000 | Ano |
| 6,080,932 | A | 6/2000 | Smith et al. |
| 6,087,717 | A | 7/2000 | Ano et al. |
| 6,177,636 | B1 | 1/2001 | Fjelstad |
| 6,198,165 | B1 | 3/2001 | Yamaji et al. |
| 6,232,650 | B1 * | 5/2001 | Fujisawa et al. ............. 257/666 |
| 6,232,661 | B1 | 5/2001 | Amagai et al. |
| 6,242,815 | B1 | 6/2001 | Hsu et al. |
| 6,271,057 | B1 | 8/2001 | Lee et al. |
| 6,331,451 | B1 | 12/2001 | Fusaro et al. |
| 6,358,780 | B1 | 3/2002 | Smith et al. |
| 6,552,430 | B1 | 4/2003 | Perez et al. |
| 6,580,159 | B1 | 6/2003 | Fusaro et al. |
| 6,774,317 | B2 | 8/2004 | Fjelstad |
| 6,861,757 | B2 | 3/2005 | Shimoto et al. |
| 6,977,348 | B2 | 12/2005 | Ho et al. |

(Continued)

*Primary Examiner* — Marc Armand
(74) *Attorney, Agent, or Firm* — Foley & Lardner LLP

(57) ABSTRACT

A semiconductor package includes a substrate, a die, and a package body. The substrate includes: (a) a core including a resin reinforced with fibers; (b) a plurality of openings extending through the core; (c) a dielectric layer; and (d) a single conductive layer disposed between the dielectric layer and the core. Portions of a lower surface of the single conductive layer cover the plurality of openings to form a plurality of first contact pads for electrical connection external to the semiconductor package. Exposed portions of an upper surface of the single conductive layer form a plurality of second contact pads. The die is electrically connected to the plurality of second contact pads, and the package body encapsulates the die.

20 Claims, 11 Drawing Sheets

U.S. PATENT DOCUMENTS

| | | |
|---|---|---|
| 7,338,884 B2 | 3/2008 | Shimoto et al. |
| 7,423,340 B2 | 9/2008 | Huang et al. |
| 7,612,295 B2 | 11/2009 | Takada et al. |
| 2002/0171145 A1* | 11/2002 | Higuchi et al. .............. 257/738 |
| 2002/0182776 A1* | 12/2002 | Fujisawa et al. ............. 438/118 |
| 2004/0080054 A1 | 4/2004 | Chinda et al. |
| 2005/0186704 A1* | 8/2005 | Yee et al. ..................... 438/106 |
| 2008/0284017 A1* | 11/2008 | Lee et al. ..................... 257/738 |
| 2010/0288541 A1 | 11/2010 | Appelt et al. |
| 2010/0289132 A1 | 11/2010 | Huang et al. |
| 2010/0314744 A1 | 12/2010 | Huang et al. |
| 2011/0057301 A1 | 3/2011 | Chen et al. |
| 2011/0084370 A1 | 4/2011 | Su et al. |
| 2011/0084372 A1 | 4/2011 | Su et al. |
| 2011/0169150 A1 | 7/2011 | Su et al. |

* cited by examiner

SEMICONDUCTOR PACKAGE WITH SUBSTRATE HAVING SINGLE METAL LAYER AND MANUFACTURING METHODS THEREOF

CROSS-REFERENCES TO RELATED APPLICATIONS

The present application claims the benefit of U.S. Provisional Application No. 61/177,652, filed on May 13, 2009, and Taiwan Application No. 98124118, filed on Jul. 16, 2009, the subject matters of which are incorporated herein by reference.

BACKGROUND OF THE INVENTION

1. Field of the Invention

The present invention generally relates to electronic device packaging. More particularly, the present invention relates to substrates for semiconductor packages, and manufacturing methods thereof.

2. Description of Related Art

Integrated circuit (IC) package technology plays an important role in the electronics industry. As light weight, compactness, and high efficiency have become typical requirements of consumer electronic and communication products, chip packages should provide superior electrical properties, small overall volume, and a large number of I/O ports. Substrates used in these chip packages often have multiple metal layers that can be electrically connected using traces and/or vias. As the size of chip packages decreases, these traces and vias for connecting the multiple metal layers can become smaller and more closely spaced, which can increase the cost and complexity of integrated circuit packaging processes. It is therefore desirable to develop a substrate that has a thin profile, that is manufactured by a less complex process, that is suitable for mass production, and that can be produced with high production yield. It is also desirable to develop corresponding packages including the substrate, and manufacturing methods of the substrate and of the corresponding packages.

SUMMARY OF THE INVENTION

Accordingly, one aspect of the present invention is directed to a substrate having a single metal layer, a semiconductor package including the substrate, and manufacturing methods thereof.

In one innovative aspect, embodiments of the invention relate to a semiconductor package. The semiconductor package includes a substrate, a die, and a package body. The substrate includes: (a) a core including a resin reinforced with fibers; (b) a plurality of openings extending through the core; (c) a dielectric layer; and (d) a single conductive layer disposed between the dielectric layer and the core, the single conductive layer including an upper surface, a lateral surface, and a lower surface. Portions of the lower surface of the single conductive layer cover the plurality of openings to form a plurality of first contact pads for electrical connection external to the semiconductor package. Exposed portions of the upper surface of the single conductive layer form a plurality of second contact pads. The die is electrically connected to the plurality of second contact pads, and the package body encapsulates the die.

In another innovative aspect, embodiments of the invention relate to a method of fabricating a substrate for a semiconductor package. In one embodiment, the method includes providing a substrate including: (a) a core including a reinforced resin, the core defining a lower surface of the substrate and being formed with a plurality of through holes extending through the core, the core having a thickness in the range of 15 microns to 24 microns; (b) a dielectric layer defining an upper surface of the substrate; and (c) a single electrically conductive layer disposed between the core and the dielectric layer.

In another innovative aspect, embodiments of the invention relate to a substrate for a semiconductor package. The substrate includes: (a) a core including a reinforced resin; (b) a plurality of openings extending through the core; (c) a dielectric layer; and (d) a single conductive layer disposed between the dielectric layer and the core. Portions of a lower surface of the single conductive layer cover the plurality of openings to form a plurality of first contact pads for electrical connection external to the semiconductor package. The substrate has a thickness in the range of 80 microns to 120 microns.

Figure 1A:
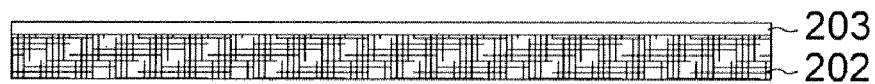
FIGS. 1A through 1F are cross section views showing a method of manufacturing a substrate having a single metal layer, according to an embodiment of the invention.

The drawings illustrate embodiments of the invention and, together with the description, serve to explain the principles of some embodiments of the invention. Reference will now be made in detail to some embodiments of the invention, examples of which are illustrated in the accompanying drawings. Wherever possible, the same reference numbers are used in the drawings and the descriptions to refer to the same or like features.

DETAILED DESCRIPTION OF THE INVENTION

Referring to FIGS. 1A through 1F, cross section views are illustrated that show a method of manufacturing a substrate having a single metal layer, according to an embodiment of the invention. In one embodiment, a copper clad laminate (CCL) is provided that includes a core 202 located between two metal foils. Alternatively, the core 202 may be attached to a single metal foil, or may be a stand-alone core. The core 202 should be thin to reduce the thickness of a substrate and a package structure including the core 202. In one embodiment, the core 202 has a thickness in the range of about 25 μm (microns) to about 100 μm, such as from about 25 μm to about 40 μm, from about 25 μm to about 50 μm, and from about 25 μm to about 75 μm, although the thickness of the core 202 is not constrained to this range. For example, the core 202 can have a thickness in the range of about 15 μm to about 100 μm, such as from about 15 μm to about 24 μm, from about 15 μm to about 25 μm, from about 15 μm to about 40 μm, and from about 15 μm to about 50 μm.

At the same time, the core 202 should also be sufficiently strong and rigid so that warpage of a substrate and a package structure including the core 202 is sufficiently small to meet practical application requirements. This warpage may occur during the manufacturing process of the substrate and/or the package structure, such as during molding. At thicknesses in the range of about 15 μm to about 100 μm, a core made of reinforced resin materials may be sufficiently strong and rigid to meet these requirements. In some embodiments, the tensile modulus and/or Young's modulus of the core 202 may be in the range of about 10 GPa to about 40 GPa, such as from about 15 GPa to about 40 GPa, from about 20 GPa to about 40 GPa, and from about 30 GPa to about 40 GPa. To increase the strength and rigidity of the core 202, in one embodiment, the core 202 can be made of resin reinforced with fibers, such as glass fibers or Kevlar fibers (aramid fibers). The core 202 may be in the form of a film reinforced with fibers.

Examples of resin materials that may be reinforced by fibers for use in the core 202 include Ajinomoto build-up film (ABF), bismaleimide triazine (BT), polyimide (PI), liquid crystal polymer (LCP), epoxy, and other resin materials. Alternatively, the core 202 may include resin with a single metal foil, where the resin is reinforced by fiber. It is not intended that the material of core 202 be limited to these illustrative compounds. Afterwards, in one embodiment, the two metal foils of the CCL are removed to obtain the core 202, which may also be referred to as a base or other terms known to those of ordinary skill in the art. An adhesive layer 203 is attached to the upper surface of the core 202, as shown in FIG. 1A. Alternatively, the adhesive layer 203 may be attached to the stand-alone core 202, which is not attached to any metal foils. Alternatively, the adhesive layer 203 may be attached to a metal foil, such as in an embodiment where the core 202 includes resin with a single metal foil.

Figure 1B:
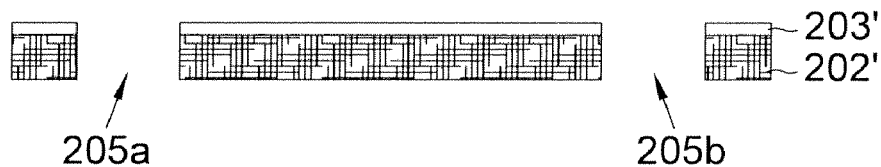

Next, the core 202 and the adhesive layer 203 are patterned to form a plurality of openings 205a and 205b, such as through holes. The openings 205a and 205b extend through the core 202 and the adhesive layer 203, as shown in FIG. 1B. The patterning of the core 202 may be done by stamping, chemical etching, or computer-aided drilling methods (such as laser drilling or mechanical drilling). For an embodiment in which the core 202 is a glass fiber-reinforced material, it is preferable to pattern the core 202 by stamping, mechanical drilling, or laser drilling. In one embodiment, the openings 205a and 205b can be formed by mechanical drilling of stacked cores for cost savings. The process for patterning the core 202 and the configurations of the openings 205a and 205b may vary from that illustrated in FIG. 1B, depending on the specific requirements of a practical application.

Then, an electrically conductive layer 207 is disposed adjacent to the adhesive layer 203'. A patterned, electrically conductive layer 207' may be formed from the electrically conductive layer 207 through an image-transfer process, such as etching, as shown in FIG. 1D. The patterned, electrically conductive layer 207' may be made of, but is not limited to, a metal material, such as copper or a copper alloy. In one embodiment, the patterned, electrically conductive layer 207' includes a plurality of contact pads, such as bonding pads 2073 (upper contact pads), die support pad 2071, and ball pads 2075 (lower contact pads), where the ball pads 2075 are positioned corresponding to the openings 205a and 205b. Also, the patterned, electrically conductive layer 207' may optionally include a dummy trace for reducing warpage of the substrate.

Figure 1C:
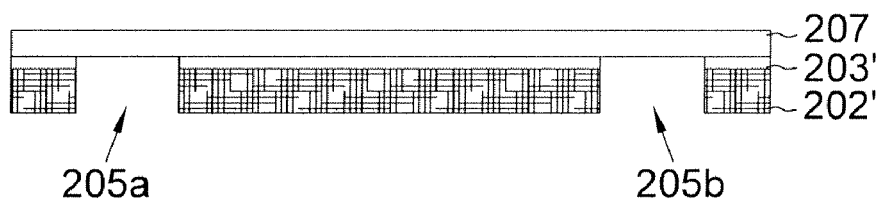
Figure 1D:
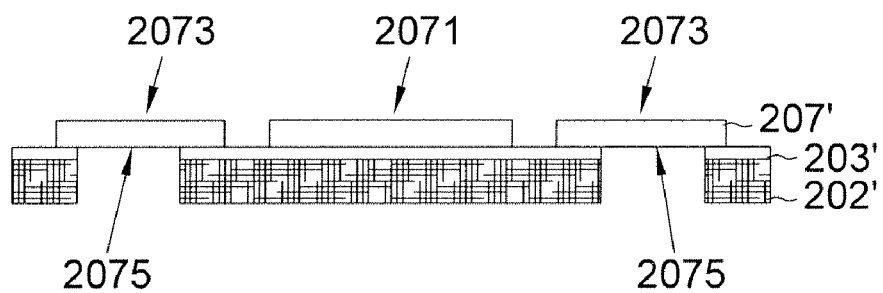
Figure 1E:
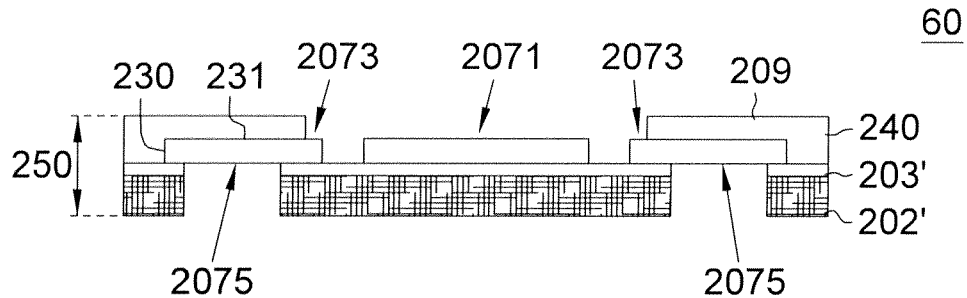

Next, a patterned dielectric layer 209 is formed on the patterned, electrically conductive layer 207' to form a substrate 60, as shown in FIG. 1E. An overall thickness 250 of the substrate 60 may be in the range of about 40 μm to about 150 μm, and may also be in one of the ranges of about 40 μm to about 60 μm, about 60 μm to about 80 μm, about 80 μm to about 100 μm, about 80 μm to about 120 μm, and about 40 μm to about 130 μm, although the thickness of the substrate 60 is not constrained to any of these ranges. The patterned, electrically conductive layer 207' is disposed between the patterned base 202' and the patterned dielectric layer 209. The patterned dielectric layer 209 may be formed to cover at least a part of an upper surface 231 of the patterned, electrically conductive layer 207', such that the patterned dielectric layer 209 exposes a remaining part of the upper surface 231 to form the bonding pads 2073. In one embodiment, the patterned, electrically conductive layer 207' is laterally positioned with respect to the substrate 60 so as to be bounded within sides 240 (a lateral periphery) of the substrate 60. The sides 240 of the substrate 60 may be defined by singulation of a substrate strip including an array of multiple substrates 60. Every lateral surface 230, or a subset of the lateral surfaces 230, of the patterned, electrically conductive layer 207' may be recessed from the sides 240 of the substrate 60. The distance by which the lateral surfaces 230 are recessed from the sides 240 may be in the range of about 10 μm to about 250 μm, and may also be in the range of about 10 μm to about 100 μm. The patterned dielectric layer 209 may be formed to cover one or more lateral surfaces 230 of the patterned, electrically conductive layer 207'. In one embodiment, the patterned dielectric layer 209 is formed to cover lateral surfaces 230 such that the patterned, electrically conductive layer 207' is not exposed anywhere on the lateral periphery 240 of the substrate 60.

By covering portions of the electrically conductive layer 207', the patterned dielectric layer 209 helps to protect the electrically conductive layer 207' from environmental effects such as oxidation and moisture, and enhances electrical performance of the substrate 60. The dielectric layer 209 also facilitates an increase in density of electrical connections and/or traces in the electrically conductive layer 207' by helping to reduce electromigration between adjoining traces.

The patterned dielectric layer 209 may overlap the ball pads 2075 directly above the openings 205a and 205b (which are juxtaposed with the ball pads 2075), as shown in FIG. 1C and FIG. 1E. In other words, the patterned dielectric layer 209 may cover the openings 205a and 205b juxtaposed with the ball pads 2075, viewed from the upper surface of the core 202. In one embodiment, the patterned dielectric layer 209 includes an open slot to expose at least one of the bonding pads 2073. The patterned dielectric layer may be made of, but is not limited to, a dielectric material comprising solder mask (SM), liquid crystal polymer (LCP), prepreg (PP), ABF, epoxy, or polyimide.

Figure 1F:
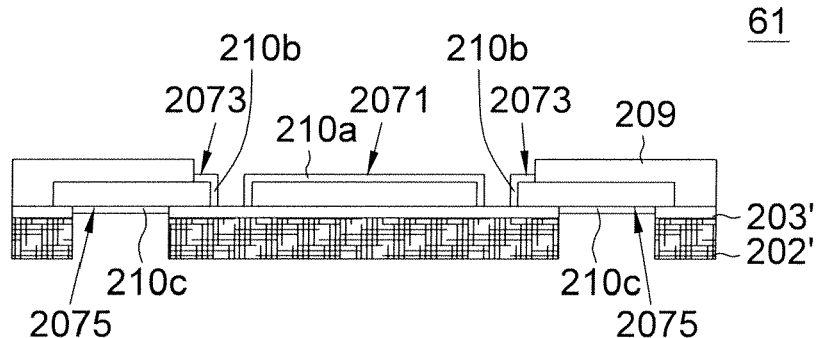

Moreover, the substrate 60 of FIG. 1E may optionally be further subjected to a surface treatment to form surface finish layers on one or more exposed surfaces of the patterned metal layer 207', such as the die support pad 2071, the bonding pads 2073, and the ball pads 2075 to form a substrate 61, as shown in FIG. 1F. These surface finish layers can enhance electrical connection to the substrate 61. As shown in FIG. 1F, a surface finish layer 210a and/or 210b is deposited on at least portions of the upper surface and sidewalls of the die support pad 2071, and on at least portions of the upper surface and sidewalls of the bonding pads 2073, respectively. Another surface finish layer 210c is formed on at least one of the surfaces of the ball pads 2075. Also, materials chosen for making the surface finish layers 210a, 210b, and 210c may be identical or different. In one embodiment, materials of the surface finish layers 210a, 210b, and 210c are independently selected from the group consisting of Ni/Au, NiPdAu, Ni/μg, Au, Tin, Tin-lead alloy, silver, OSP and any combination thereof. Alternatively, the final surface treatments for the first and second contact pads can be performed by selective plating of electroless nickel/electroless palladium/immersion gold (ENEPIG) and OSP depending on application requirements.

Figure 2:
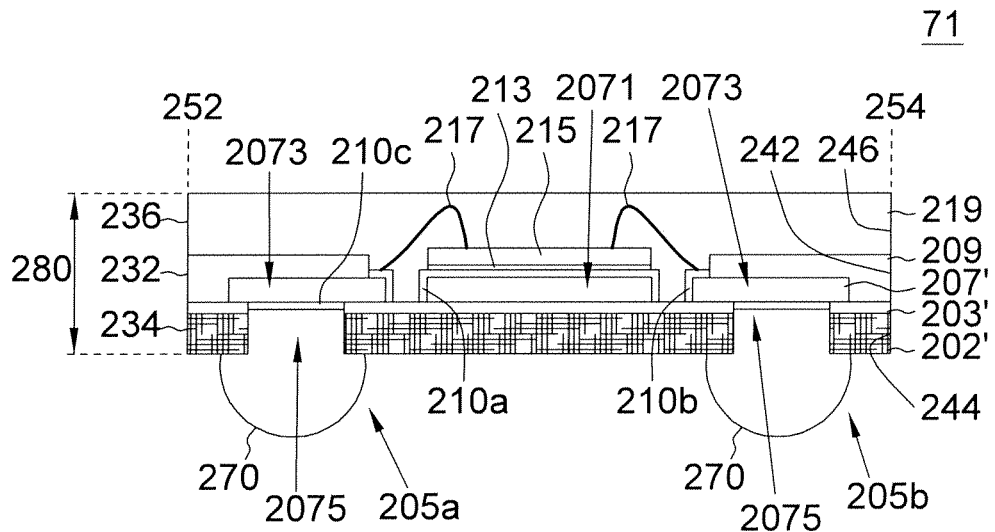
FIG. 2 is a cross section view showing a chip package structure including the substrate of FIG. 1F, according to an embodiment of the invention.

FIG. 2 is a cross section view showing a chip package structure 71 including the substrate 61 of FIG. 1F, according to an embodiment of the invention. Alternatively, a chip package structure that is in most respects similar to the chip package structure 71 may be formed including the substrate 60 of FIG. 1E (such as without one or more of the plating layers 210a, 210b, and 210c). The package 71 includes the substrate 61 as presented in FIG. 1F, a die 215 adjacent to the die support pad 2071, bonding wires 217, and a package body 219. A lower surface of the die 215 is attached to the surface finish layer 210a on the die support pad 2071 with an adhesive material 213 (such as epoxy). The active surface of the die 215, mounted in a "face up" orientation, is electrically connected to the bonding pads 2073 through the bonding wires 217. Alternatively, the die 215 may be mounted in a "face down" or flip chip orientation and electrically connected to the substrate 61 by means of conductive bumps, pillars, balls, or other conductive elements.

A molding compound is applied adjacent to the upper surface of the patterned base 202' to cover the patterned dielectric layer 209, the die 215, and the bonding wires 217. After application of the molding compound to a substrate strip including an array of multiple substrates 61, singulation may be used to separate the resulting structure into multiple individual packages 71, where each package 71 includes an individual substrate 61, and an individual package body 219 formed from the molding compound. The bonding wires 217 may be formed of at least one of gold, silver, copper, aluminum, and alloys thereof. The material selected for the molding compound should be electrically insulating, such as epoxy. In an embodiment, a continuous portion of the patterned base 202' is formed under the die support pad 2071, and the openings 205a and 205b are positioned outside the die support pad 2071, as shown in FIG. 2. In one embodiment, the openings 205a and 205b may be filled with a conductive material for electrical connection to at least one of the ball pads 2075, such as in the form of conductive bumps 270, such as solder bumps.

In one embodiment, upon completion of the assembly process, as shown in FIG. 2, and prior to package singulation, each assembled package 71 may be electrically tested because they are electrically isolated from each other.

In one embodiment, a lateral surface 236 of the package body 219, a lateral surface 232 of the patterned dielectric layer 209, and a lateral surface 234 of the patterned base 202' define the plane 252. Similarly, a lateral surface 246 of the package body 219, a lateral surface 242 of the patterned dielectric layer 209, and a lateral surface 244 of the patterned base 202' may define the plane 254.

In one embodiment, the package 71 has a thickness 280 in the range of about 200 μm to about 500 μm, such as from about 200 μm to about 350 μm, from about 300 μm to about 350 μm, from about 300 μm to about 400 μm, from about 300 μm to about 450 μm, and from about 300 μm to about 500 μm, although the thickness of the package 71 is not constrained to this range.

In the embodiment of the substrate 61 illustrated in FIG. 1F and FIG. 2, the patterned metal layer 207' is disposed adjacent to the adhesive layer 203', and at least part of the patterned metal layer 207' covers the openings 205a and 205b to form the ball pads 2075 for electrical connection externally to, for example, the package 71 including the substrate 61. The external electrical connection may be downward from the ball pads 2075. The patterned dielectric layer 209 formed on the patterned metal layer 207' exposes at least part of the upper surface of the patterned metal layer 207' to form the bonding pads 2073. The bonding pads 2073 may be used for wire bonding connections, such as to bonding wires 217. The electrical connection may be upward from the bonding pads 2073.

Figure 3A:
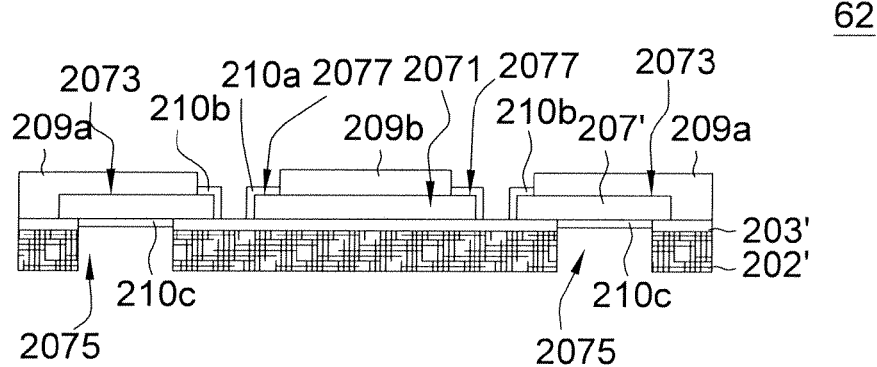
FIG. 3A is a cross section view showing an alternative substrate manufactured according to an embodiment of the invention.

FIG. 3A is a cross section view showing an alternative substrate 62 manufactured according to an embodiment of the invention. The substrate 62 of FIG. 3A is similar to the substrate 61 of FIG. 1F except that the die support pad 2071 is partially covered by the patterned dielectric layer 209. The substrate 62 is also formed using a similar method to that used to form the substrate 61, with modifications to partially cover the die support pad 2071 with the patterned dielectric layer 209. As shown in FIG. 3A, the patterned dielectric layer 209a formed on the patterned metal layer 207' may overlap the ball pads 2075 directly above the openings 205a and 205b. The patterned dielectric layer 209b may cover a part of the die support pad 2071, and may expose a remaining part of the die support pad 2071 to form additional bonding pads 2077. Then, a surface treatment, such as Ni/Au treatment, may be performed to form surface finish layers on one or more exposed surfaces of the patterned metal layer 207'. As shown in FIG. 3A, the surface finish layer 210a and/or 210b is deposited on at least portions of the upper surface and sidewalls of the die support pad 2071 (including the bonding pads 2077) and the bonding pads 2073, respectively. The surface finish layer 210c is formed on at least one of the surfaces of the ball pads 2075. The surface finish patterns of the substrate 61 of FIG. 1F and the substrate 62 of FIG. 3A are somewhat different. The surface finish layer 210a of FIG. 1F covers the upper surface and sidewalls of the die support pad 2071. In contrast, the surface finish layer 210a of FIG. 3A covers the sidewalls and only part of the top surface of the die support pad 2071. The surface finish patterns can be optionally varied depending on practical application requirements.

Figure 3B:
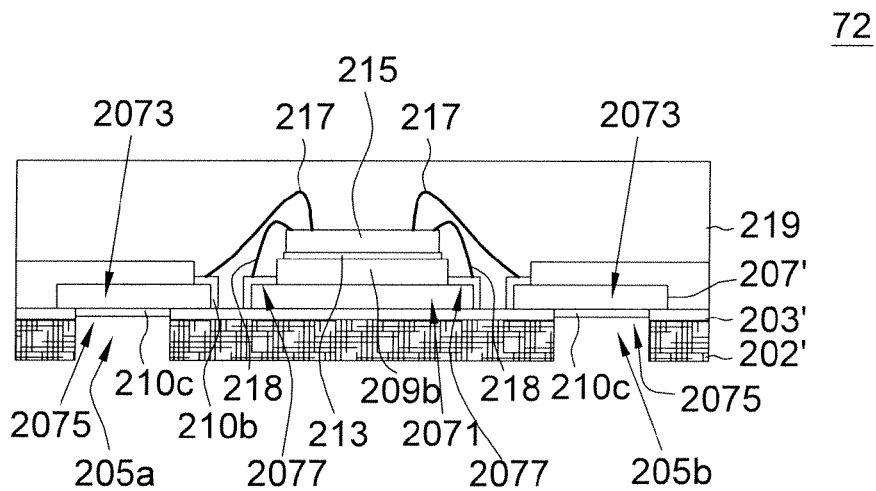
FIG. 3B is a cross section view showing a chip package structure including the substrate of FIG. 3A, according to an embodiment of the invention.

FIG. 3B is a cross section view showing a chip package structure 72 including the substrate 62 of FIG. 3A, according to an embodiment of the invention. The package 72 includes the substrate 62 as presented in FIG. 3A, the die 215, the bonding wires 217 and 218, and the package body 219. The package 72 of FIG. 3B is similar to the package 71 of FIG. 2 (described previously) except that the die support pad 2071 is partially covered by the patterned dielectric layer 209b, and that the die 215 is electrically connected to additional bonding pads 2077 through the bonding wires 218. In this embodiment, the lower surface of the die 215 is attached to the patterned dielectric layer 209b (above the die support pad 2071) with the adhesive material 213, such as epoxy. The active surface of the die 215 is electrically connected to the bonding pads 2073 through the bonding wires 217, and is electrically connected to the bonding pads 2077 through the bonding wires 218. The molding compound 219 is applied adjacent to the upper surface of the patterned base 202' to cover the patterned dielectric layer 209 (including 209a and 209b), the die 215, and the bonding wires 217 and 218.

Figure 12:
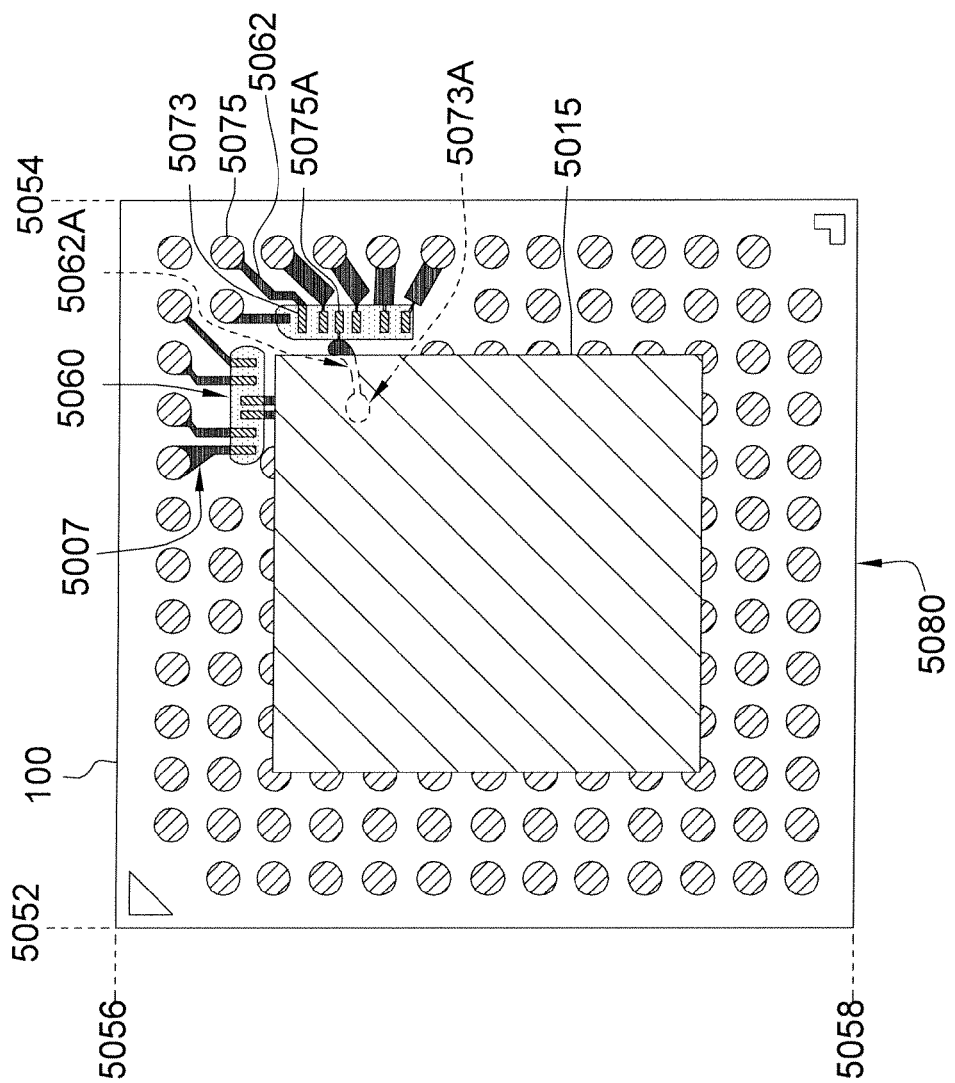
FIG. 12 is a top view of a substrate having a single patterned, electrically conductive layer, according to an embodiment of the invention.

In one embodiment, a continuous portion of the patterned base 202' is formed under the die support pad 2071, so there are no through holes extending through the portion of the patterned base 202' under the die support pad 2071, and no ball pads under the die support pad 2071. The bonding pads 2077 may be electrically connected to other ball pads 2075 located in, for example, the openings 205a and 205b. The openings 205a and 205b are outside a lateral periphery of the die support pad 2071, so this embodiment can be referred to as a fan-out embodiment. These electrical connections may be metal traces (not shown in FIG. 3B) included in the patterned, electrically conductive layer 207'. Similar metal traces are illustrated in FIG. 12.

Figure 4A:
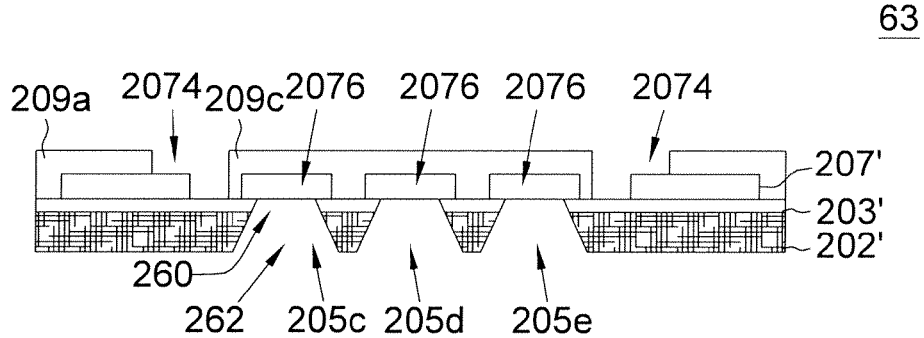
FIG. 4A is a cross section view of another substrate manufactured according to an embodiment of the invention.

FIG. 4A is a cross section view of another substrate 63 manufactured according to an embodiment of the invention. The substrate 63 of FIG. 4A is similar to the substrate 60 of FIG. 1E except that the positions of through holes 205c, 205d, and 205e shown in FIG. 4A correspond to the position of the die 215 (e.g., are under the die 215). The patterned, electrically conductive layer 207', the patterned base 202', and the patterned dielectric layer are formed in a similar way to that described in FIGS. 1A through 1F, with the difference being that bonding pads 2074 and ball pads 2076 associated with the through holes 205c, 205d and 205e are formed. The patterned dielectric layer 209c is formed such that the ball pads 2076 are entirely covered by the patterned dielectric layer 209c. Then, a surface treatment (such as Ni/Au treatment) may optionally be performed to form surface finish layers on one or more exposed surfaces of the patterned metal layer 207' (not shown in FIG. 4A).

In the embodiment illustrated in FIG. 4A, laser drilling is used to form the openings 205c, 205d, and 205e. In this embodiment, the opening 205c defines a first area 262 adjacent to the lower surface of the patterned base 202', and a second area 260 adjacent to the upper surface of the patterned base 202', where the first area 262 is larger than the second area 260. The openings 205d and 205e have similar characteristics. Alternatively, openings formed by mechanical drilling or stamping may be shaped similarly to the openings 205a and 205b illustrated in, for example, FIG. 2.

Figure 4B:
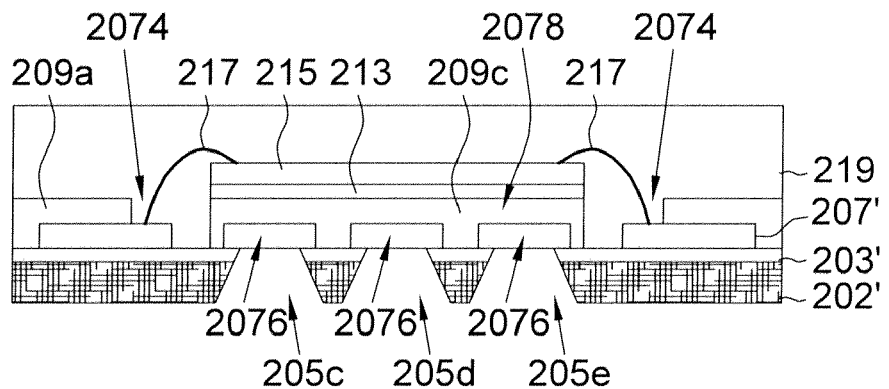
FIG. 4B is a cross section view showing a chip package structure including the substrate of FIG. 4A, according to an embodiment of the invention.

FIG. 4B is a cross section view showing a chip package structure including the substrate of FIG. 4A, according to an embodiment of the invention. The package 73 includes the substrate 63 as presented in FIG. 4A, a die 215, the bonding wires 217 and the package body 219. The package 73 of FIG. 4B is similar to the package 71 of FIG. 2 (described previously) except for certain aspects described below. A lower surface of the die 215 is attached to the patterned dielectric layer 209c (which serves as a die support pad 2078) with an adhesive material 213 such as epoxy. The active surface of the die 215 is electrically connected to the bonding pads 2074 through the bonding wires 217. In an embodiment, a continuous portion of the patterned base 202' is formed under the bonding pads 2074, and the openings 205c, 205d, and 205e are positioned under the die support pad 2078. The die 215 of the package 73 is electrically connected to an external element such as a printed circuit board (not shown) through the ball pads 2076 beneath the die support pad 2078. In one embodiment, the openings 205c, 205d, and 205e may be filled with a conductive material for electrical connection to at least one of the ball pads 2076.

In one embodiment, a continuous portion of the patterned base 202' is formed outside the die support pad 2078, so that the through holes 205c, 205d, and 205e are under the die support pad 2078, and no ball pads are outside the die support pad 2078. The bonding pads 2074 may be electrically connected to the ball pads 2076 located in, for example, the through holes 205c, 205d, and 205e. The openings 205c, 205d, and 205e are inside a lateral periphery of the die support pad 2071, so this embodiment can be referred to as a fan-in embodiment. These electrical connections may be metal traces (not shown in FIG. 4B) included in the patterned, electrically conductive layer 207'. Similar metal traces are illustrated in FIG. 12. In particular, as shown in FIG. 12, traces such as trace 5062A route electrical signals under a die 5015 to ball pads (such as ball pad 5073A) under the die 5015. In fan-in embodiments, since all ball pads are under the die, all traces connecting to the ball pads (such as trace 5062A) are isolated under the die. A resulting advantage of fan-in is that package footprint size can be decreased.

In addition, like the embodiment illustrated in FIG. 4A, laser drilling is used to form the openings 205c, 205d, and 205e. Alternatively, openings formed by mechanical drilling or stamping may be shaped similarly to the openings 205a and 205b illustrated in, for example, FIG. 2.

As illustrated in FIG. 4B, the patterned dielectric layer 209c may overlap the ball pads 2076 directly above the openings 205c, 205d, and 205e. Thus, the patterned dielectric layer 209 covers the through holes 205c, 205d, and 205e juxtaposed with the ball pads 2076, viewed from the upper surface of the core 202.

In one embodiment, an adhesive layer 203/203' is used as part of fabricating the substrate, with the patterned base 202' positioned adjacent to the adhesive layer 203', as shown in FIG. 1F, FIG. 3A and FIG. 4A. Compared to typical substrates having multiple metal layers, the substrates 60-63 described above are very thin, and may have a thickness in the range of about 40 µm to about 150 µm. The thickness of the substrates 60-63 may also be in one of the ranges of about 40 µm to about 60 µm, about 60 µm to about 80 µm, and about 80 µm to about 100 µm, about 80 µm to about 120 µm, and about 40 µm to about 130 µm, although the thickness of the substrates 60-63 are not constrained to any of these ranges. As a result, the size of packages including the substrates 60-63 can be effectively reduced.

Although several types of substrates (60-63) and packages (71-73) have been illustrated in the embodiments so far described, modifications and variations to the substrates, the packages including the substrates, manufacturing methods thereof, and related embodiments can be made within the scope of the invention to meet the requirements of practical applications. For example, the structure of the base and of the metal layer can be varied from those illustrated, depending to the specific requirements of the device. Also, the die may be wire bonded or flip-chip bonded to the substrate.

Figure 5A:
FIGS. 5A through 5H are cross section views showing a method of manufacturing a substrate having a single metal layer, according to an embodiment of the invention.

Referring to FIGS. 5A through 5H, cross section views are illustrated that show a method of manufacturing a substrate having a single metal layer, according to an embodiment of the invention. A core 302 is provided, where the core 302 has similar characteristics to those of the core 202 described previously (see FIG. 1A). A metal layer 303 is formed on the upper surface of the core 302, as shown in FIG. 5A. The metal layer 303 can be formed by, for example, deposition, plating, or lamination. Note that, in one embodiment, no adhesive layer is disposed between the core 302 and the metal layer 303, unlike the embodiment illustrated in FIGS. 1A-1F.

Figure 5B:
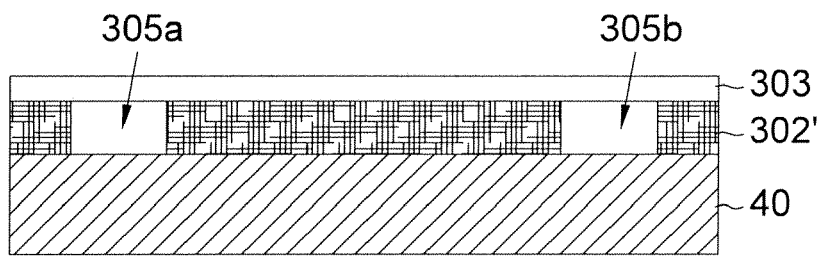

Next, the core 302 is patterned to form a patterned base 302' defining through holes or blind via holes 305a and 305b, where the patterning of the core 302 has similar characteristics to those of the patterning of the core 202 described previously (see FIG. 1B). The lower surface of the patterned base 302' is also placed on a carrier 40, as shown in FIG. 5B.

Figure 5C:
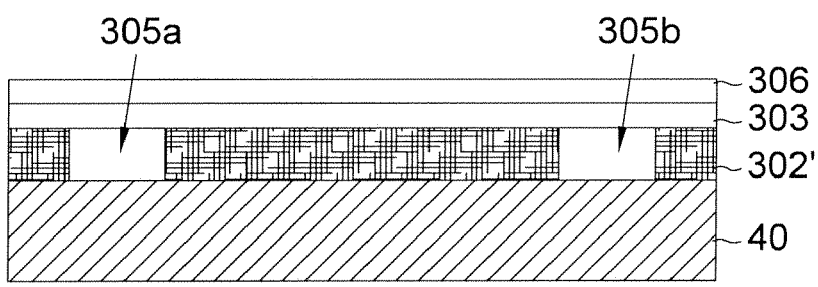
Figure 5D:
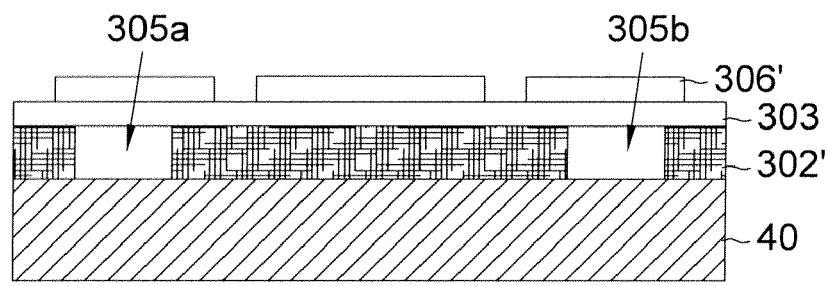
Figure 5E:
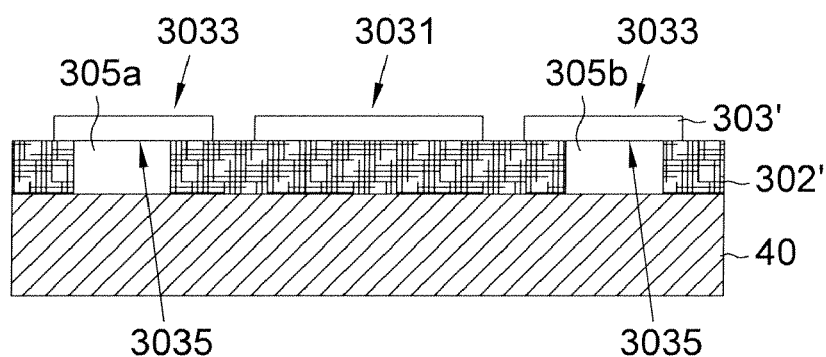

Next, the metal layer 303 is patterned. In one embodiment, a dry film 306 is formed on the metal layer 303 as shown in FIG. 5C, followed by exposing and developing to form a patterned dry film 306' as shown in FIG. 5D. The metal layer 303 may then be etched based on the patterned dry film 306' to form the patterned metal layer 303'. The patterned dry film 306' is then removed, as shown in FIG. 5E. In an embodiment, the patterned metal layer 303' includes bonding pads 3033, die support pad 3031, and ball pads 3035. The bonding pads 3033, the die support pad 3031, and the ball pads 3035 have similar characteristics to those of the bonding pads 2073, the die support pad 2071, and the ball pads 2075 described previously (see FIGS. 1C-1E and FIG. 2). For example, in one embodiment, the ball pads 3035 may be positioned correspondingly to the through holes 305a and 305b. Also, the patterned metal layer 303' may optionally include a dummy trace for reducing warpage of the substrate.

Figure 5F:
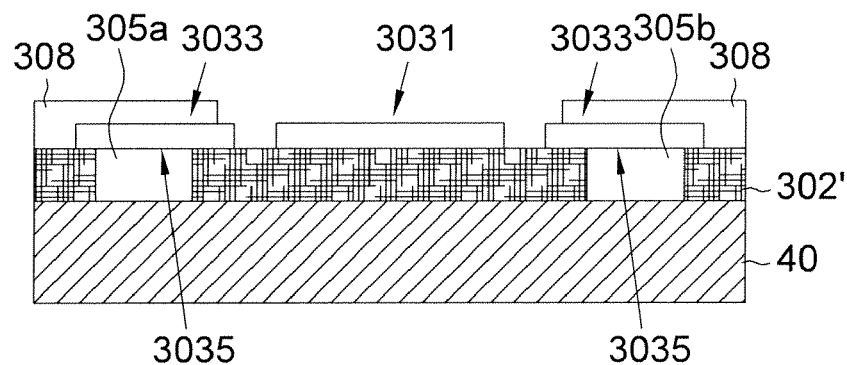

Next, a patterned dielectric layer 308 is formed on the patterned metal layer 303', as shown in FIG. 5F. The patterned dielectric layer 308 has similar characteristics to those of the patterned dielectric layer 209 described previously (see FIGS. 1E-1F and FIG. 2). For example, the patterned dielectric layer 308 may overlap the ball pads 3035 directly above the openings 305a and 305b (which are juxtaposed with the ball pads 3035), as shown in FIG. 5C and FIG. 5F. In one embodiment, the patterned dielectric layer 308 includes an open slot to expose the bonding pads 3033. The patterned dielectric layer 308 may be made of, but is not limited to, a dielectric material comprising solder mask (SM), liquid crystal polymer (LCP), prepreg (PP), ABF, epoxy, or polyimide.

Figure 5G:
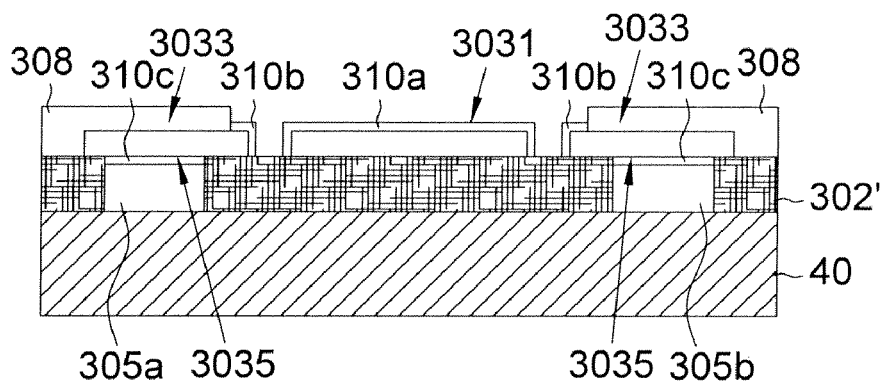

Moreover, the structure shown in FIG. 5F may optionally be further subjected to a surface treatment to form surface finish layers on one or more exposed surfaces of the patterned metal layer 303', such as the die support pad 3031, the bonding pads 3033, and the ball pads 3035. This is shown in FIG. 5G. Surface finish layers 310a, 310b, and 310c have similar characteristics to those of the surface finish layers 210a, 210b, and 210c previously described (see FIG. 1F).

Then, the structure formed so far (such as a substrate strip including an array of substrates 64) is removed from the carrier 40. The substrate 64 is presented in FIG. 5H.

Figure 5H:
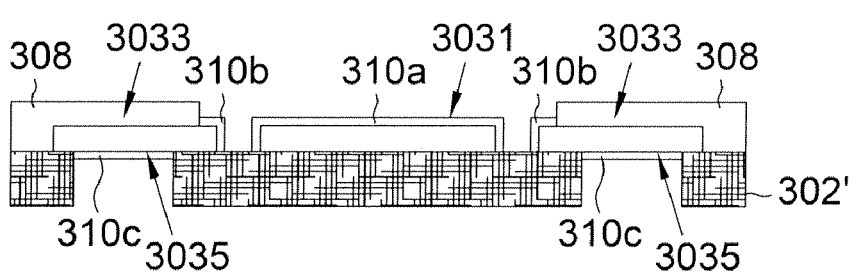
Figure 6:
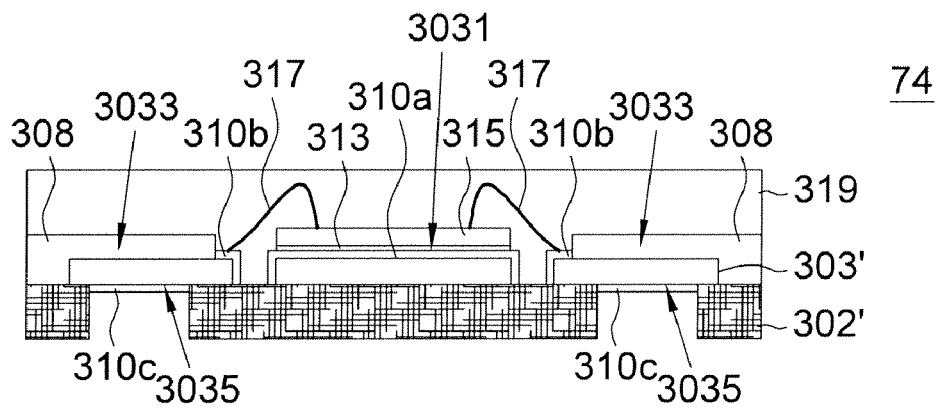
FIG. 6 is a cross section view showing a chip package structure including the substrate of FIG. 5H, according to an embodiment of the invention.

FIG. 6 is a cross section view showing a chip package structure 74 including the substrate 64 of FIG. 5H, according to an embodiment of the invention. The package 74 is similar to the package 71 shown in FIG. 2, except that the package 74 does not include an adhesive layer (such as the adhesive layer 203' in FIG. 2) between the patterned base 302' and the patterned, electrically conductive layer 303'. The package 74 includes a die 315, bonding wires 317, an adhesive material 313 between the die 315 and the surface finish layer 310a, and a package body 319, which have similar characteristics to the die 215, the bonding wires 217, the adhesive material 213, and the package body 219, respectively (shown in FIG. 2).

Figure 7A:
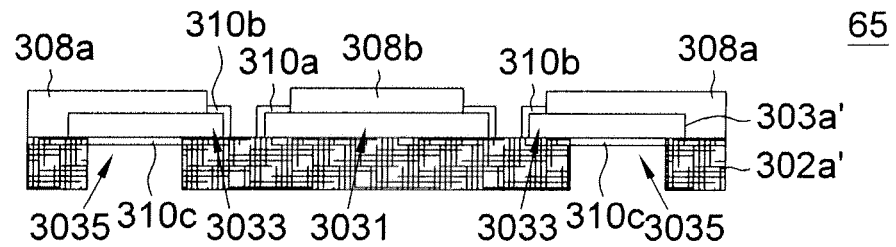
FIG. 7A is a cross section view showing an alternative substrate manufactured according to an embodiment of the invention.

FIG. 7A is a cross section view showing an alternative substrate 65 manufactured according to an embodiment of the invention. The substrate 65 is similar to the substrate 62 shown in FIG. 3A, except that the substrate 65 does not include an adhesive layer (such as the adhesive layer 203' in FIG. 3A) between a patterned base 302a' (similar to the patterned base 202' in FIG. 2) and a patterned, electrically conductive layer 303a' (similar to the patterned, electrically conductive layer 207' in FIG. 2). The substrate 65 includes patterned dielectric layer 308 (308a and 308b) and surface finish layer 310 (310a and 310b), which have similar characteristics to the patterned dielectric layer 209 (209a and 209b) and the surface finish layer 210 (210a and 210b), respectively (shown in FIG. 3A).

Figure 7B:
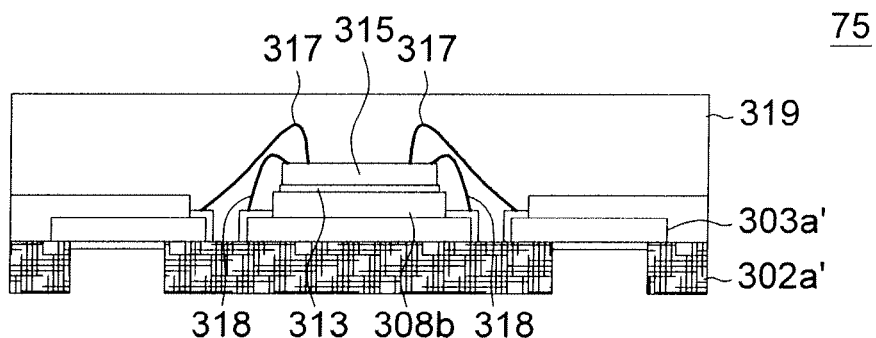
FIG. 7B is a cross section view showing a chip package structure including the substrate of FIG. 7A according to an embodiment of the invention.

FIG. 7B is a cross section view showing a chip package structure 75 including the substrate 65 of FIG. 7A according to an embodiment of the invention. The package 75 is similar to the package 72 shown in FIG. 3B, except that the package 75 does not include an adhesive layer (such as the adhesive layer 203' in FIG. 3B) between the patterned base 302a' (similar to the patterned base 202' in FIG. 3B) and the patterned, electrically conductive layer 303a' (similar to the patterned, electrically conductive layer 207' in FIG. 3B). The package 75 includes a die 315, bonding wires 317 and 318, an adhesive material 313 between the die 315 and the patterned dielectric layer 308b, and a package body 319, which have similar characteristics to the die 215, the bonding wires 217 and 218, the adhesive material 213, and the package body 219, respectively (shown in FIG. 3B).

Figure 8A:
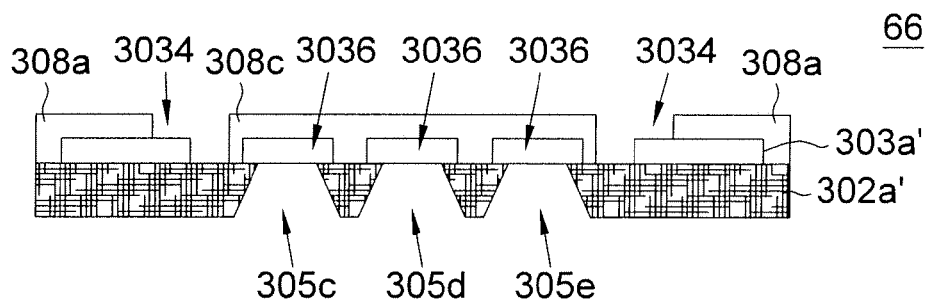
FIG. 8A is a cross section view of another substrate manufactured according to an embodiment of the invention.

FIG. 8A is a cross section view of another substrate 66 manufactured according to an embodiment of the invention. The substrate 66 is similar to the substrate 63 shown in FIG. 4A, except that the substrate 66 does not include an adhesive layer (such as the adhesive layer 203' in FIG. 4A) between a patterned base 302a' (similar to the patterned base 202' in FIG. 4A) and a patterned, electrically conductive layer 303a' (similar to the patterned, electrically conductive layer 207' in FIG. 4A). The substrate 66 includes patterned dielectric layer 308 (308a and 308c), bonding pads 3034, ball pads 3036, and openings 305c, 305d, and 305e, which have similar characteristics to the patterned dielectric layer 209 (209a and 209c), bonding pads 2074, ball pads 2076, and openings 205c, 205d, and 205e, respectively (shown in FIG. 4A).

Figure 8B:
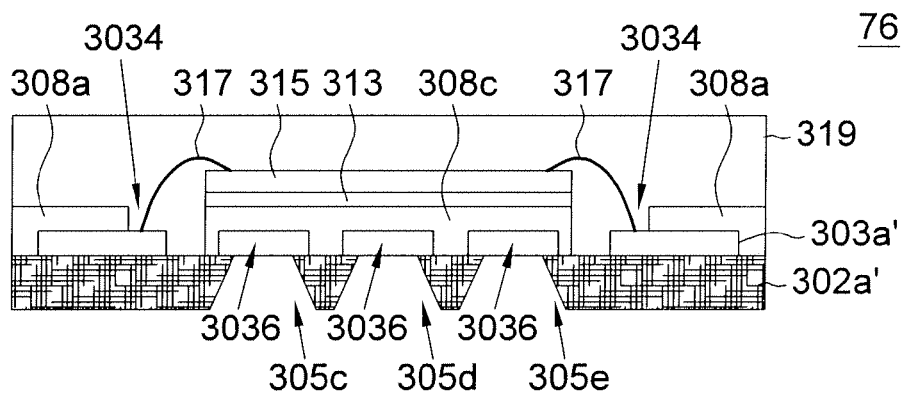
FIG. 8B is a cross section view showing a chip package structure including the substrate of FIG. 8A manufactured according to an embodiment of the invention.

FIG. 8B is a cross section view showing a chip package structure 76 including the substrate 66 of FIG. 8A manufactured according to an embodiment of the invention. The package 76 is similar to the package 73 shown in FIG. 4B, except that the package 76 does not include an adhesive layer (such as the adhesive layer 203' in FIG. 4B) between the patterned base 302a' (similar to the patterned base 202' in FIG. 4B) and the patterned, electrically conductive layer 303a' (similar to the patterned, electrically conductive layer 207' in FIG. 4B). The package 76 includes the die 315, the bonding wires 317, the adhesive material 313 between the die 315 and the patterned dielectric layer 308b, and the package body 319, which have similar characteristics to the die 215, the bonding wires 217, the adhesive material 213, and the package body 219, respectively (shown in FIG. 4B).

Figure 9A:
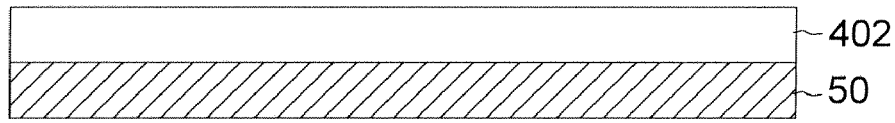
FIGS. 9A through 9I are cross section views showing a method of manufacturing a substrate having a single patterned metal layer, according to an embodiment of the invention.
Figure 9B:
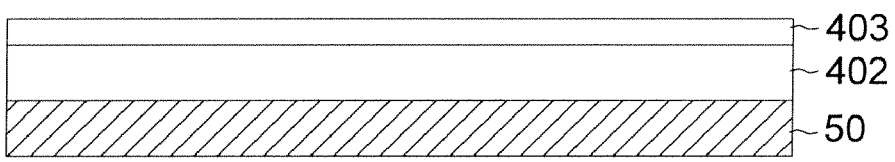

Referring to FIG. 9A through 9I, cross section views are illustrated that show a method of manufacturing a substrate having a single metal layer, according to an embodiment of the invention. A base 402 is provided and placed on a carrier 50, as shown in FIG. 9A. In this embodiment, an Ajinomoto Build-up Film (ABF) re-inforced with fibers, such as glass fibers, is used as the base. In terms of thickness and rigidity, the base 402 has similar characteristics to those of the core 202 described previously (see FIG. 1A). A metal layer 403, such as a copper layer, is formed on the upper surface of the base 402, as shown in FIG. 9B.

Figure 9C:
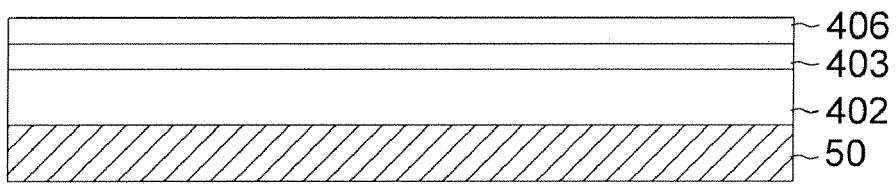
Figure 9D:
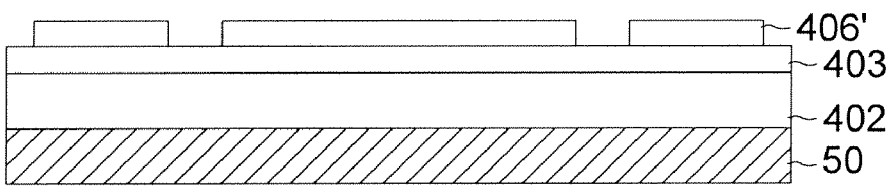
Figure 9E:
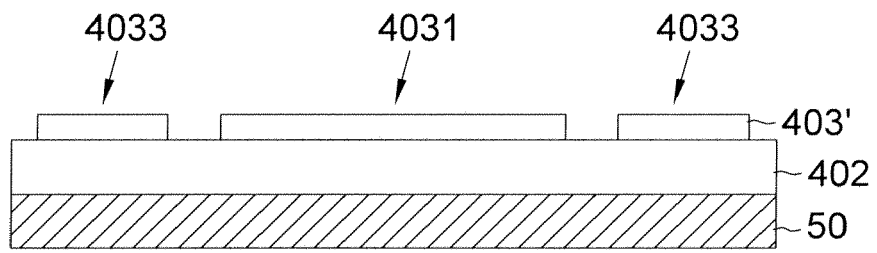
Figure 9F:
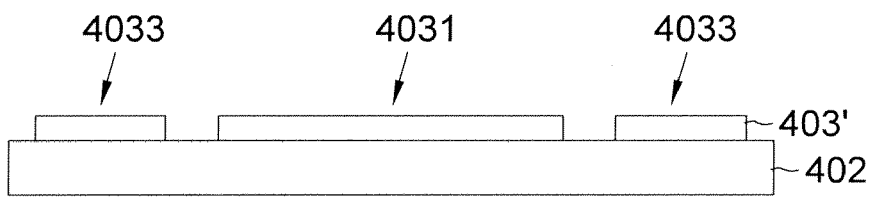

Next, the metal layer 403 is patterned. In one embodiment, a dry film 406 is formed on the metal layer 403 as shown in FIG. 9C, followed by exposing and developing to form a patterned dry film 406' as shown in FIG. 9D. The metal layer 403 may then be etched based on the patterned dry film 406' to form the patterned metal layer 403'. The patterned dry film 406' is then removed, as shown in FIG. 9E. In an embodiment, the patterned metal layer 403' includes bonding pads 4033 and die support pad 4031. The bonding pads 4033 and the die support pad 4031 have similar characteristics to those of the bonding pads 2073 and the die support pad 2071 described previously (see FIGS. 1C-1E and FIG. 2). Also, the patterned metal layer 403' may optionally include a dummy trace for reducing warpage of the substrate. Then, the carrier 50 is removed, as shown in FIG. 9F.

Figure 9G:
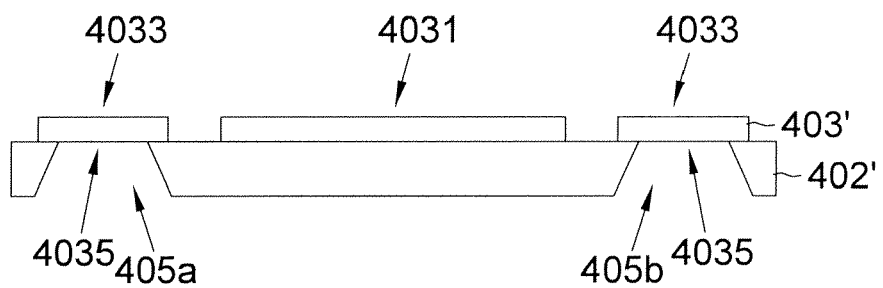

Next, as shown in FIG. 9G, the base 402 is patterned to form a patterned base 402' defining through holes 405a and 405b, where the patterning of the base 402 has similar characteristics to those of the patterning of the core 202 described previously (see FIG. 1B).

Figure 9H:
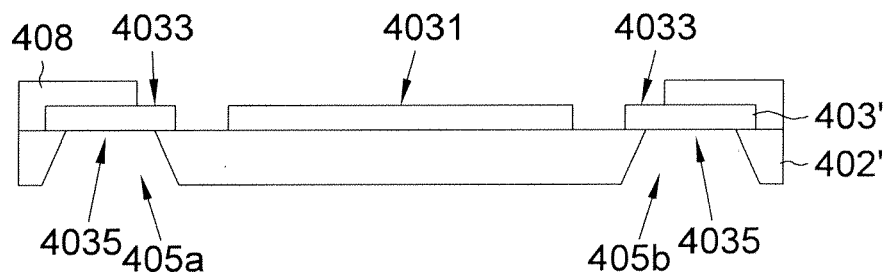

Next, a patterned dielectric layer 408 is formed on the patterned metal layer 403', as shown in FIG. 9H. The patterned dielectric layer has similar characteristics to those of the patterned dielectric layer 209 described previously (see FIGS. 1E-1F and FIG. 2). For example, the patterned dielectric layer 308 may overlap the ball pads 4035 directly above the openings 405a and 405b (which are juxtaposed with the ball pads 4035), as shown in FIG. 9H. In one embodiment, the patterned dielectric layer 408 includes an open slot to expose the bonding pads 4033. The patterned dielectric layer 408 may be made of, but is not limited to, a dielectric material comprising solder mask (SM), liquid crystal polymer (LCP), prepreg (PP), ABF, epoxy, or polyimide.

The substrate of FIG. 9H may optionally be further subjected to a surface treatment to form surface finish layers on one or more exposed surfaces of the patterned metal layer 403', such as the die support pad 4031, the bonding pads 4033, and the ball pads 4035. Surface finish layers 410a, 410b, and 410c have similar characteristics to those of the surface finish layers 210a, 210b, and 210c previously described (see FIG. 1F).

Figure 9I:
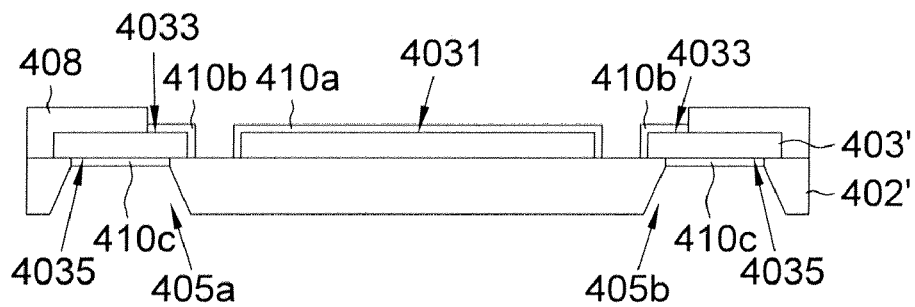

It is noted that substrate 67 of FIG. 9I is similar to the substrate 64 of FIG. 5H, except that the openings 405a and 405b have the tapered profile of the openings 205c, 205d, and 205e (see FIG. 4A). Also, in one embodiment, a package including the substrate 67 of FIG. 9I may be similar to the package 74 of FIG. 6.

In the embodiment of FIGS. 5A-5H, several through holes are formed in the core 302 before setting the core on the carrier, and the patterned metal layer is formed on the upper surface of the core after setting the core on the carrier. In contrast, in the embodiment of FIGS. 9A-9I, the patterned metal layer is formed on upper surface of the core before forming the through holes or blind via holes in the base 402.

Figure 10:
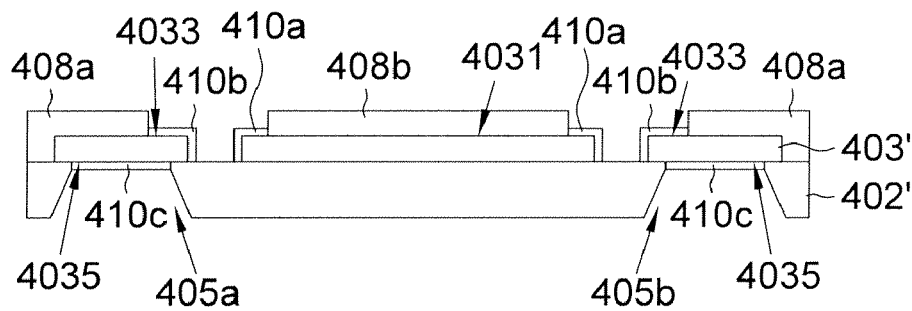
FIG. 10 is a cross section view showing an alternative substrate manufactured according to an embodiment of the invention.

FIG. 10 is a cross section view showing an alternative substrate 68 manufactured according to an embodiment of the invention. The substrate 68 is similar to the substrate 65 shown in FIG. 7A, except that the openings 405a and 405b have the tapered profile of the openings 205c, 205d, and 205e (see FIG. 4A). The substrate 68 includes patterned dielectric layer 408 (408a and 408b) and surface finish layer 410 (410a and 410b), which have similar characteristics to the patterned dielectric layer 308 (308a and 308b) and the surface finish layer 310 (310a and 310b), respectively (shown in FIG. 7A). In one embodiment, ball pads can be added under the die support pad 4031.

Figure 11:
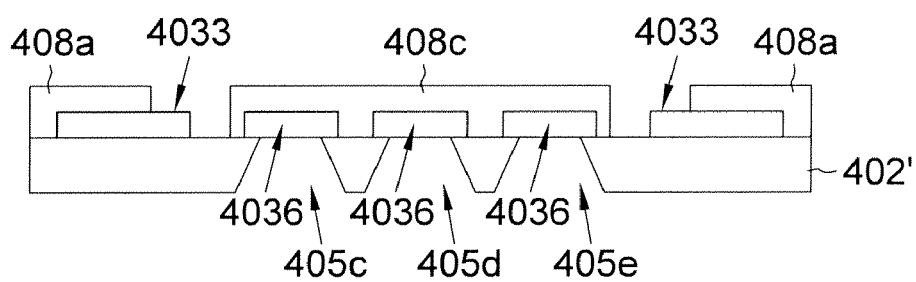
FIG. 11 is a cross section view of another substrate manufactured according to an embodiment of the invention.

FIG. 11 is a cross section view of another substrate 69 manufactured according to an embodiment of the invention. The substrate 69 is similar to the substrate 66 shown in FIG. 8A. In one embodiment, a package including the substrate 69 may be similar to the package 76 shown in FIG. 8B. The substrate 69 includes patterned dielectric layer 408 (408a and 408c), bonding pads 4033, ball pads 4036, and openings 405c, 405d, and 405e, which have similar characteristics to the patterned dielectric layer 308 (308a and 308c), bonding pads 3034, ball pads 3036, and openings 305c, 305d, and 305e, respectively (shown in FIG. 8A).

Modifications and variations to the substrate 69 depicted in FIG. 11, packages including the substrate 69, manufacturing methods thereof, and related embodiments can be made within the scope of the invention to meet the requirements of practical applications.

FIG. 12 is a top view of a substrate 100 having a single patterned, electrically conductive layer 5007, according to an embodiment of the invention. The patterned, electrically conductive layer 5007 has similar characteristics to those of the patterned, electrically conductive layer 207' previously described (see FIG. 1D and FIG. 2), although the patterned, electrically conductive layer 5007 can be shaped differently. A die 5015 is shown as overlaid on the substrate 100. In this embodiment, bonding pads 5073 and ball pads 5075 are illustrated. The ball pads 5075 are positioned under the die 5015, and are also positioned outside the footprint of the die 5015, so this embodiment includes both fan-in and fan-out features. In other respects, the ball pads 5075 are similar to the ball pads 2075 previously described (see FIGS. 1D-1E and FIG. 2). The bonding pads 5073 are exposed in openings or slots 5060 in a patterned dielectric layer, and are electrically connected to bonding pads 5075 through traces 5062 included in the patterned, electrically conductive layer 5007. In a similar fashion, for example, the bonding pads 2077 shown in FIGS. 3A and 3B may be electrically connected to the ball pads 2075, and the bonding pads 2073 shown in FIGS. 1D-1F and FIG. 2 may be electrically connected to the ball pads 2075. The bonding pads 5073 are similar to the bonding pads 2073 previously described (see FIGS. 1D-1E and FIG. 2). The openings 5060 expose the bonding pads 5073, similar to how the bonding pads 2073 are exposed by openings in the patterned dielectric layer 209 previously described (see FIG. 1E and FIG. 2).

A ball pad 5073A positioned under the die 5015 is shown in dashed lines, and a trace 5062A electrically connecting the ball pad 5073A to a bonding pad 5075A is shown in dashed lines. In a similar fashion, the bonding pads 2074 shown in FIGS. 4A and 4B may be electrically connected to the ball pads 2076, the bonding pads 3034 shown in FIGS. 8A and 8B may be electrically connected to the ball pads 3036, and the bonding pads 4033 shown in FIG. 11 may be electrically connected to the ball pads 4036.

The substrate 100 includes a lateral periphery 5080 that corresponds to the sides of the substrate 100. In one embodiment, singulation may occur on the cutting lines 5052, 5054, 5056, and 5058 to define the lateral periphery 5080 of the substrate 100. In one embodiment, it should be noted that a package including the substrate 100 is electrically testable before, for example, singulation occurs to separate the package including the substrate 100 from other attached packages. Singulation on planes 5052, 5054, 5056, and 5058 does not sever any traces 5062, and therefore does not meaningfully alter the electrical connectivity of the portion of the patterned, electrically conductive layer 5007 included in the package including the substrate 100, so electrical testing can take place prior to singulation.

The foregoing description and illustrations contained herein demonstrate many of the advantages associated with embodiments of the present invention. Because the substrate includes a single patterned metal layer, the thickness of the substrate is reduced, giving rise to a lower profile package. This thinner substrate is particularly suitable for small-size product applications. Also, embodiments of methods for manufacturing the substrates and packages disclosed herein may use a carrier, which render the embodiments of the methods simple, easy to perform, and suitable for mass production. Embodiments of the substrate have advantages of high yield of production, thin profile, and low cost. Electronic products including the substrate and/or the chip package structure of embodiments of the present invention can leverage these advantages to reduce the size and the cost of these products, which is commercially desirable.

Several embodiments are described and illustrated to demonstrate the structures of the substrate, chip packages including the substrate, and manufacturing methods thereof. These descriptions and illustrations do not limit the invention. Those of skill in the art would know that modifications and variations to these embodiments can be made within the scope of the invention to meet requirements of practical applications. The illustrations may not be necessarily be drawn to scale, and that there may be other embodiments of the present invention which are not specifically illustrated. Thus, the specification and the drawings are to be regarded as illustrative rather than restrictive. Additionally, the drawings illustrating the embodiments of the present invention may focus on certain major characteristic features for clarity.

What is claimed is:

1. A method of fabricating a semiconductor package, comprising:
    forming an adhesive layer on a core including a reinforced resin to form an adhesive-core composite;
    forming a stack of adhesive-core composites by stacking the adhesive-core composite on another adhesive-core composite;
    drilling the stack of adhesive-core composites to form a plurality of openings extending through the stack;
    separating an individual drilled adhesive-core composite from the drilled stack; and
    attaching a single electrically conductive layer to the individual drilled adhesive-core composite.

2. The method of claim 1, further comprising patterning the single electrically conductive layer to form:
    a die pad; and
    a plurality of lower contact pads that cover the plurality of openings and that are for electrical connection external to the semiconductor package.

3. The method of claim 1, further comprising:
    forming a dielectric layer adjacent to the single electrically conductive layer;
    patterning the dielectric layer to expose at least a part of an upper surface of the single electrically conductive layer; and
    patterning the single electrically conductive layer to form a plurality of upper contact pads and a die pad.

4. The method of claim 1, further comprising patterning the single electrically conductive layer to form a die pad and a plurality of upper contact pads.

5. The method of claim 3, wherein the patterned dielectric layer is formed such that the single electrically conductive layer is not exposed anywhere on sides of the substrate.

6. The method of claim 3, wherein the patterned dielectric layer exposes a portion of an upper surface of the die pad, and further comprising:
    forming a surface finish layer on the exposed portion of the upper surface of the die pad.

7. The method of claim 3, wherein the patterned dielectric layer fully exposes the upper surface of the die pad, and further comprising:
    forming a surface finish layer on the exposed upper surface of the die pad.

8. A method of forming a semiconductor package, comprising:
    forming a stack of cores, each of the cores including a reinforced resin;
    forming a plurality of first openings extending through the stack;
    separating a single core from the stack, the single core defining a plurality of second openings corresponding to the plurality of first openings;
    forming a single conductive layer adjacent to the single core; and
    patterning the single conductive layer to form:
        a die pad;
        a plurality of upper contact pads that are for electrical connection internal to the semiconductor package; and
        a plurality of lower contact pads that cover the plurality of second openings and that are for electrical connection external to the semiconductor package.

9. The method of claim 8, wherein each of the cores is an adhesive-core composite including an adhesive layer.

10. The method of claim 8, further comprising:
    forming a dielectric layer adjacent to the single conductive layer;
    patterning the dielectric layer, wherein the patterned dielectric layer exposes a portion of an upper surface of the die pad; and
    forming a surface finish layer on the exposed portion of the upper surface of the die pad.

11. The method of claim 8, further comprising:
    forming a dielectric layer adjacent to the single conductive layer;
    patterning the dielectric layer, wherein the patterned dielectric layer fully exposes an upper surface of the die pad; and
    forming a surface finish layer on the exposed upper surface of the die pad.

12. The method of claim 8, further comprising forming a dielectric layer adjacent to the single conductive layer such that a lateral surface of the dielectric layer is coplanar with a lateral surface of the single core.

13. The method of claim 8, further comprising:
    forming a dielectric layer adjacent to the single conductive layer; and
    patterning the dielectric layer, wherein the patterned dielectric layer is formed such that the single conductive layer is not exposed anywhere on sides of the substrate.

14. A method of forming a semiconductor package, comprising:
    forming an adhesive layer on a core including a reinforced resin to form an adhesive-core composite;
    forming a stack of adhesive-core composites by stacking the adhesive-core composite on another adhesive-core composite;

forming a plurality of first openings extending through the stack;

separating a single adhesive-core composite from the stack, the single adhesive-core composite defining a plurality of second openings corresponding to the plurality of first openings;

forming a single conductive layer on the single adhesive-core composite; and forming a patterned dielectric layer adjacent to the single conductive layer to expose at least a part of an upper surface of the single electrically conductive layer; and patterning the single conductive layer to form a plurality of contact pads and a die pad.

15. The method of claim 14, wherein the plurality of contact pads include:

a plurality of lower contact pads that cover the plurality of openings and that are for electrical connection external to the semiconductor package; and a plurality of upper contact pads for electrical connection to a die.

16. The method of claim 14, wherein the patterned dielectric layer exposes a portion of an upper surface of the die pad, and further comprising forming a surface finish layer on the exposed portion of the upper surface of the die pad.

17. The method of claim 14, wherein the patterned dielectric layer fully exposes an upper surface of the die pad, and further comprising forming a surface finish layer on the exposed upper surface of the die pad.

18. The method of claim 14, wherein the patterned dielectric layer is formed such that the single conductive layer is not exposed anywhere on sides of the substrate.

19. The method of claim 14, wherein the patterned dielectric layer is formed such that a lateral surface of the patterned dielectric layer is coplanar with a lateral surface of the single adhesive-core composite.

20. The method of claim 14, wherein the forming the plurality of first openings is through mechanical drilling.

* * * * *